United States Patent [19]

Tobita

[11] Patent Number: 4,742,250
[45] Date of Patent: May 3, 1988

[54] INNER POTENTIAL GENERATING CIRCUIT
[75] Inventor: Youichi Tobita, Hyogo, Japan
[73] Assignee: Mitsubishi Denki Kabushiki Kaisha, Tokyo, Japan
[21] Appl. No.: 943,054
[22] Filed: Dec. 18, 1986
[30] Foreign Application Priority Data Dec. 20, 1985 [JP] Japan ................. 60-288205

[51] Int. Cl.$^4$ .............. H03K 3/01; H03K 3/353; H03K 3/26
[52] U.S. Cl. ................... 307/296 R; 307/304; 307/297; 307/279
[58] Field of Search ........... 307/296 R, 297, 304, 307/279

[56] References Cited

U.S. PATENT DOCUMENTS 4,044,373 8/1977 Nomiya et al. .............. 307/304
4,208,595 6/1980 Gladstein et al. ............. 307/304
4,409,496 10/1983 Baba ........................ 307/304

FOREIGN PATENT DOCUMENTS 0062894 10/1982 European Pat. Off. ........ 307/296 R
0062147 10/1985 Japan ..................... 307/296 R

OTHER PUBLICATIONS

"A 20ns Static Column 1Mb DRAM in CMOS Technology", K. Sato et al, IEEE International Solid-State Circuits Conference, Feb. 15, 1985, pp. 254–255.

Primary Examiner—Stanley D. Miller
Assistant Examiner—Trong Q. Phan
Attorney, Agent, or Firm—Lowe, Price, Leblanc, Becker & Shur

[57] ABSTRACT

A main potential generating circuit 11a receives AC voltage from a first AC power supply 40 and charges a substrate potential output terminal 9 with a prescribed potential. On the other hand, a reference potential generating circuit 11b receives AC voltage from a pulse generating circuit 3 as a second AC power supply and charges a reference potential point 9b with a prescribed potential. A differential amplifying circuit 20 detects difference between the potential of the substrate potential output terminal 9 and the potential of the reference potential point 9b and only when the difference is detected, it operates the first AC power supply 40 to charge the substrate potential output terminal 9.

1 Claim, 5 Drawing Sheets

INNER POTENTIAL GENERATING CIRCUIT

BACKGROUND OF THE INVENTION

1. Field of the Invention

The present invention relates to an inner potential generating circuit and particularly to an inner potential generating circuit for use in a dynamic random access memory or the like.

2. Description of the Prior Art

FIG. 1 is a circuit diagram showing a conventional inner potential generating circuit. Referring to FIG. 1, a potential at a power supply terminal 1 (connected to an external power supply not shown) and a potential at ground 2 are kept $V_{DD}$ and 0 volt, respectively. A pulse generating circuit 3 as an AC power supply receives electric power from the power supply terminal 1 and the ground 2 so that it generates a pulse signal $\phi$. This pulse generating circuit 3 comprises a ring oscillating circuit using for example a MOS field effect transistor (referred to hereinafter as MOS FET). An output terminal of the pulse generating circuit 3 is connected to an electrode of a coupling capacitor 5 at a node 4. The other electrode of the coupling capacitor 5 is connected with a drain and a gate of a discharging MOS FET 7 at a node 6. The source of the discharging MOS FET 7 is connected to the ground 2. The other electrode of the coupling capacitor 5 is also connected to the source of a charging MOS FET 8 at a node 6. The drain and the gate of the charging MOS FET 8 are connected to a substrate potential output terminal 9. The substrate potential output terminal 9 is connected to a semiconductor substrate of a semiconductor device not shown (for example a dynamic random access memory). A parasitic capacitor 10 exists between the substrate potential output terminal 9 and the ground 2. The coupling capacitor 5, the discharging MOS FET 7 and the charging MOS FET 8 constitute a potential generating circuit 11. The potential generating circuit 11 receives the pulse signal $\phi$ of the pulse generating circuit 3 at the node 4 to charge the substrate so that the potential at the substrate potential output terminal 9 may be $V_{SUB}$.

In the following, operation of the above described conventional inner potential generating circuit will be described. For the purpose of simplification of the explanation, it is assumed that the pulse generating circuit 3 comprises for example a complementary MOS FET circuit (referred to hereinafter as a CMOS circuit) and that the output signal of this circuit is a rectangular wave excited sufficiently between the potentials $V_{DD}$ and 0 volt at the power supply terminal 1 and the ground 2, the time required for the rise and the fall thereof being negligible compared with a cycle of the output signal. The MOS FET's 7 and 8 are n channel MOS FET's and a threshold voltage $V_{TH}$ is assumed to be 0 volt.

FIG. 2 shows by (a), (b) and (c), potentials V4, V6 and V9 at the nodes 4 and 6 and the substrate potential output terminal 9, respectively, in a transitional state at the "n"th cycle of the pulse signal after turning on of the external power supply in the above indicated case. Assuming that conditions V4=0 volt and V6=V9=V(n−1)<0 are given immediately before the time t(n)0, V4 becomes $V_{DD}$ at the time t(n)0 and since impedance of the capacitor 5 is sufficiently smaller than the impedance of the MOS FET's 7 and 8, V6 is increased by $V_{DD}$ so that the condition V6=$V_{DD}$−V(n−1)>0 is satisfied. Since the MOS FET 7 is turned on and the MOS FET 8 is turned off in the case of V6>0, the potential V6 becomes 0 at the time t(n)1 when the time nearly equivalent to a time constant defined by the capacitor 5 and the MOS FET 7 passed and V6=0 is maintained till the time t(n)2 when the potential changes next. Since the MOS FET 8 is turned off during the period of V6=0, the potential V9 does not undergo any change and V9=V(n−1) is maintained. When the potential V4 becomes 0 volt at the time t(n)2, the potential V6 becomes V6=−$V_{DD}$<0 volt for the same reason as described above in the case of the time t(n)0. However, at the time t(n)2, the MOS FET 7 is turned off and the MOS FET 8 is turned on oppositely to the above described case. Accordingly, before the time t(n)3 attained by a lapse of time nearly equivalent to a time constant defined by the capacitors 5 and 10 and the MOS FET 8, the potentials V6=−$V_{DD}$ and V9=V(n−1) are changed to V6=V9=V(n)=V(n−1)−ΔV(n)<0 and the condition V6=V9=V(n) is maintained till the time t(n+1)0 when V4 changes next. Assuming that the capacitance values of the capacitors 5 and 10 are C5 and C10, a relation between V(n) and V(n−1) becomes as indicated in the following equation, if the law of invariability of electric charge is applied around the change from the time t(n)2 to the time t(n)3.

$$(C5+C10)V(n) = -C5V_{DD}+C10V(n-1)$$

This equation can be changed as follows.

$$(C5+C10)(V(n)+V_{DD}) = C10(V(n-1)+V_{DD})$$

If V(0)=0 is applied, the following equation is obtained.

$$V(n) = -V_{DD}[1-\{C10/(C10+C5)\}^n] \quad (1)$$

Since C10/(C10+C5)<1, it can be seen that as n increases, V(n) approaches −$V_{DD}$.

The equation (1) is established in the case of the threshold voltage $V_{TH}$ of the MOS FET's 7 and 8 being 0 volt. However, if transistors of the enhancement type of $V_{TH}$>0 volt are used as the MOS FET's 7 and 8, the potential V6 becomes equal to $V_{TH}$ at the above stated time t(n)1 when the MOS FET 7 in the on state turns off and, similarly, the potential V9 becomes V6+$V_{TH}$ at the time t(n)3 when the MOS FET 8 in the on state turns off. Thus, in the case of the enhancement type MOS FET's, the following equation for V9 similar to the equation (1) is obtained with regard to V9(n).

$$V9(n) = -(V_{DD}-2V_{TH})[1-\{C10/(C10+C5)\}^n] \quad (2)$$

Noticing that the time concerned is obtained by multiplication of the above indicated n by the value of the cycle of the pulse signal, it can be seen from the equation (2) that when the power supply V1 is turned on at the time t0 to attain $V_{DD}$ as shown by (a) of FIG. 3, the potential V9($V_{SUB}$) of the substrate potential output terminal 9 starts to decrease from 0 volt at the time t0 and attains −($V_{DD}$−2$V_{TH}$) at the time t1 as shown by (b) of FIG. 3.

Thus, based on the above described principle, the conventional inner potential generating circuit generates internally and makes use of negative potential in the substrate equal to −($V_{DD}$−2$V_{TH}$).

However, the above described conventional inner potential generating circuit involves the below described problems such as a considerable loss of electric power.

In a dynamic random access memory (referred to hereinafter as a dynamic RAM) to which the above described circuit is mainly applied, there is a large difference in the value of current of the substrate for returning the above stated $V_{SUB}$ (or V9) to the ground potential, dependent on whether the dynamic RAM is in an operation state such as reading, writing or refreshing state, or in a standby state. In case of a recently developed 256K-bit or 1M-bit dynamic RAM, the current of the substrate in the operation state is several tens of μA and the current of the substrate in the standby state is several tens of pA. In a microcomputer or the like, a large storage capacity is often formed only by several hundreds of dynamic RAM's. If one word is composed of 8 bits in such a case, only about one chip out of 100 chips is related with reading and writing operation and the other chips are in a standby state. However, since the conventional inner potential generating circuit is adapted for operation with a large current in the substrate, there is involved a problem that consumption of electric power is increased in the standby state. This problem will be briefly explained in the following.

Although in the above description in connection with FIG. 1, existence of the parasitic capacitor 12 between the gate of the discharging MOS FET 7 and the ground 2 can be disregarded, the parasitic capacitor 12 becomes a problem in the standby state. If the existence of the parasitic capacitor 12 can be disregarded, the potentials V9($V_{SUB}$) and V6 attain $-(V_{DD}-2V_{TH})$ and $-(V_{DD}-V_{TH})$, respectively and accordingly the MOS FET's 7 and 8 are both turned off. Thus, the node 6 as an end of the coupling capacitor 5 is brought into a floating state, whereby charging or discharging current does not flow in the capacitor 5 and there is no consumption of electric power. However, if the parasitic capacitor 12 exists, charging or discharging current flows in the parasitic capacitor 12 through the capacitor 5 and consumption of electric power occurs. The parasitic capacitor 12 is formed through a depletion layer 13 between the channel 5y and the substrate 9a, for example as shown in FIG. 4, in case where the coupling capacitor 5 is formed by a MOS channel capacitor with the gate electrode 5x and the channel 5y being connected to the node 4 and the node 6, respectively. The coupling capacitor 5 shown in FIG. 4 comprises a gate insulating film 14 and an n+ diffusion region 15 for obtaining an electrode from the channel 5y. In FIG. 4, although the parasitic capacitor 12 is connected to the substrate 9a, namely, the substrate potential output terminal 9, the potential of the substrate 9a is almost constant and this structure is equivalent to a structure viewed from the standpoint of AC, in which the parasitic capacitor 12 is connected to the ground 2. If comparison is made between the capacitance values per unit area of the gate electrode 5x and the substrate 9a with respect to the channel 5y, the capacitance value per unit area of the substrate 9a is approximately 1/10 of that of the gate electrode 5x and accordingly the capacitance value of the parasitic capacitor 12 becomes approximately 1/10 of that of the coupling capacitor 5. Since the capacitance value of the coupling capacitor 5 is as large as 100 pF in the case of a 1M-bit dynamic RAM, 1/10 of the capacitance value of the capacitor 5 becomes a considerably large value.

More specifically, although charging and discharging values for the capacitor 5 in the operation state approach substantially to 0 according to the decrease of the potentials V6 and V9, charging and discharging values for the capacitor 5 in the standby state are not lowered because a pulse generator 3 directly charges and discharges effectively the capacitor 12 having a capacitance value approximate to 1/10 of that of the capacitor 5, without regard to the capacitor 5. As a result, even in the standby state, an amount of electric power almost equal to that in the operation state is consumed.

Another prior art technique of interest to the present invention is disclosed in "A 20ns Static Column 1Mb DRAM in CMOS Technology" by Katsuyuki Satoh et al., Feb. 15, 1985, pp. 254-255. According to a method disclosed in this document, a potential of a semiconductor substrate of a semiconductor device is made constant by always operating a potential generating circuit with low consumption of electric power to supply leakage current of the semiconductor substrate and by operating a potential generating circuit with a large charging capacity during a period of low level of a raw address strobe signal $\overline{RAS}$ (namely, during a period of operation state of the semiconductor device) and/or during a period when the potential of the substrate exceeds a prescribed threshold voltage. If such a method is put into practical use, consumption of electric power in the standby state could be decreased. The above stated document discloses a back bias level detector as a circuit for detection of an excess of the potential of the substrate over the prescribed threshold voltage. However, the above stated document only discloses a circuit configuration of the back bias level detector (in FIG. 6) and gives no indication of a concrete content thereof. Consequently, the manner in which the back bias level detector detects an excess of the potential of the substrate over the prescribed threshold voltage is not clearly indicated in the above stated document. As is analogized from FIG. 6 of the above stated document, it seems that an inverter provided in the back bias level detector performs the above stated detection. However, the inverter does not have good sensitivity and if the input signal comes very close to the threshold voltage, it cannot be determined whether the output of comparison is of a high level or of a low level. Therefore, if the potential of the substrate is controlled by using such a back bias level detector, the potential of the substrate becomes unstable in the vicinity of the threshold voltage and cannot be made constant.

SUMMARY OF THE INVENTION

It is an object of the present inevention to provide an inner potential generating circuit capable of maintaining a potential of a substrate stably at a prescribed value, by which consumption of electric power can be decreased.

Briefly stated, the present invention is an inner potential generating circuit comprising a main potential generating circuit for charging a substrate potential output terminal with a prescribed potential and a reference potential generating circuit for charging a reference potential point with a prescribed potential, and it uses a differential amplifier for detecting a difference between the potential at the substrate potential output terminal (the potential of the substrate) and the potential at the reference potential point (the reference potential) so that a first AC power supply is turned on to operate the main potential generating circuit only when the difference is detected.

According to the present invention, since the first AC power supply is operated only when there is a difference between the potential of the substrate and the reference potential, consumption of electric power can be further decreased compared with the conventional example as shown in FIG. 1 in which the potential generating circuit is operated all the time. In addition, since the present invention uses a differential amplifier for detecting a difference between the substrate potential and the reference potential, the detection can be made with good sensitivity and thus the potential of the substrate can be maintained stably at the prescribed potential.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
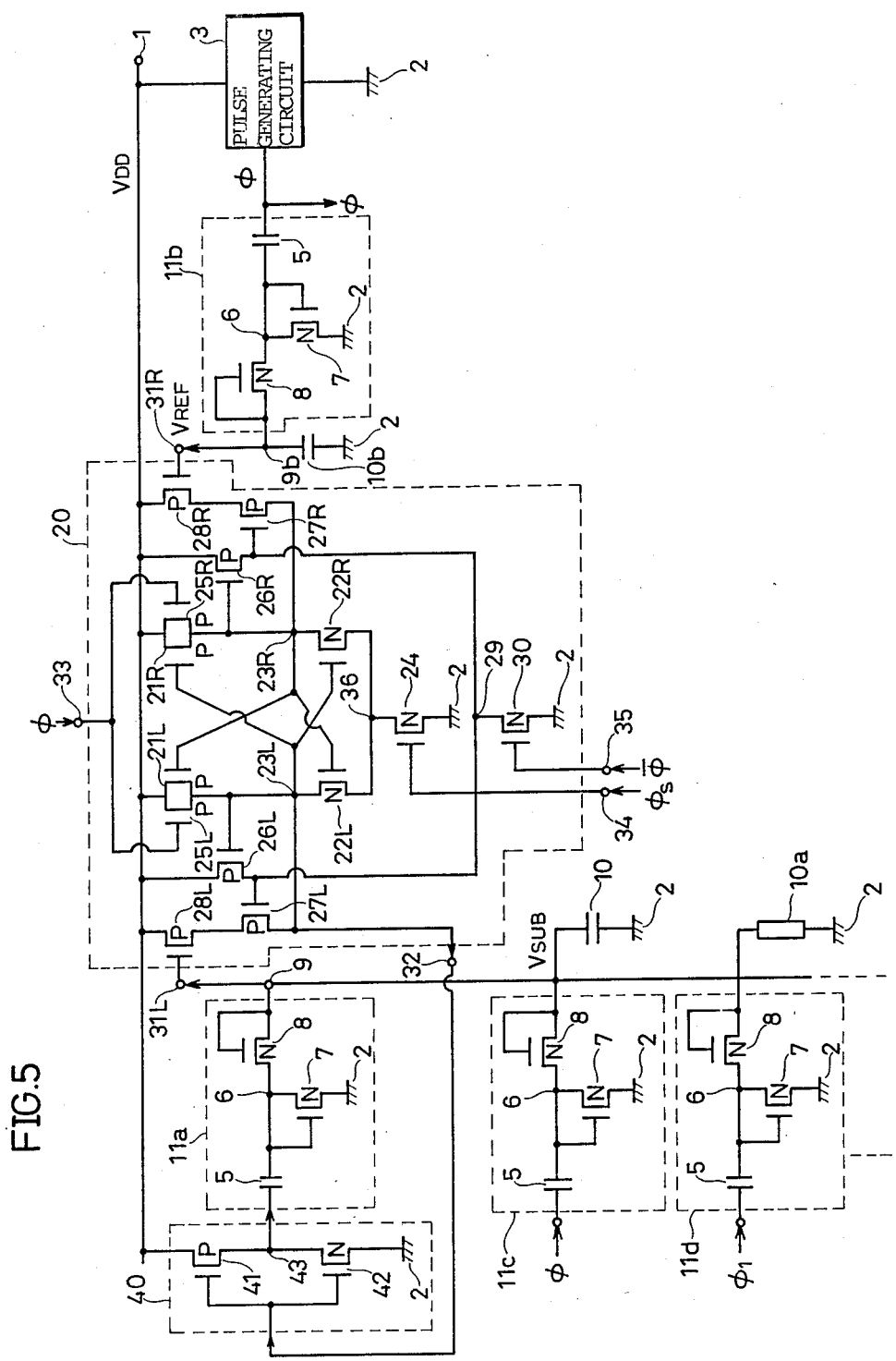
FIG. 5 is a circuit diagram showing an embodiment of the present invention.

FIG. 5 is a circuit diagram showing an embodiment of the present invention.

Figure 1:
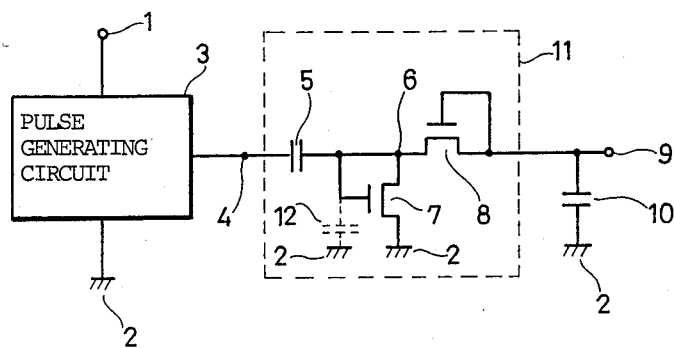
FIG. 1 is a circuit diagram showing an example of a conventional inner potential generating circuit.
Figure 2:
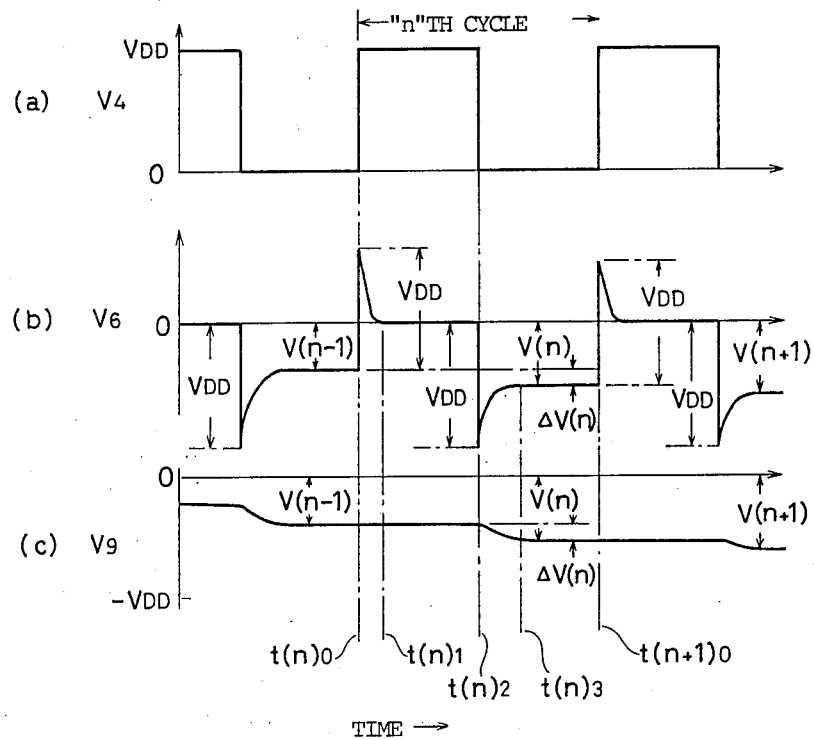
FIGS. 2 and 3 are timing chart for explaining operation of the inner potential generating circuit shown in FIG. 1.
Figure 3:
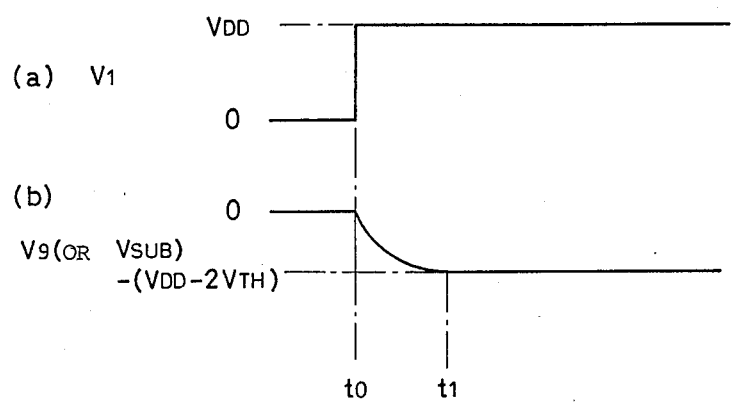
Figure 4:
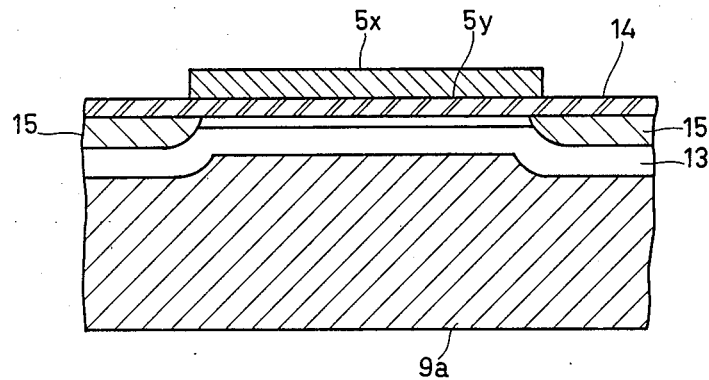
FIG. 4 is a sectional view showing a capacitor used in the conventional circuit shown in FIG. 1.

Referring to FIG. 5, this embodiment comprises a pulse generating circuit 3 as a second AC power supply, a main potential generating circuit 11a, a reference potential generating circuit 11b, a first auxiliary potential generating circuit 11c, a second auxiliary potential generating circuit 11d, a differential amplifying circuit 20 and a first AC power supply 40. The pulse generating circuit 3 is constructed in the same manner as the pulse generating circuit 3 shown in FIG. 1 and it receives electric power supplied from a power supply terminal 1 (the potential thereof being maintained at $V_{DD}$) and the ground 2 (the potential thereof being maintained at 0 volt) and generates a pulse signal $\phi$. The main potential generating circuit 11a, the reference potential generating circuit 11b, the first auxiliary potential generating circuit 11c and the second auxiliary potential generating circuit 11d are constructed respectively in the same manner as in the potential generating circuit 11 shown in FIG. 1. The main potential generating circuit 11a serves to charge a substrate potential output terminal 9 with a potential $V_{SUB}$ upon receipt of an output of the first AC power supply 40. The first auxiliary potential generating circuit 11c serves to charge the substrate potential output terminal 9 with the potential $V_{SUB}$ upon receipt of the pulse signal $\phi$ from the pulse generating circuit 3. The second auxiliary potential generating circuit 11d serves to charge the substrate potential output terminal 9 with the potential $V_{SUB}$ upon receipt of a pulse signal $\phi$ 1 from another pulse generating circuit (a pulse signal synchronizing with a raw address strobe signal $\overline{RAS}$). The substrate potential output terminal 9 is connected to a semiconductor substrate (not shown) of a semiconductor device (for example, a dynamic RAM) to which this embodiment is applied, and is also connected to a first input terminal 31L of the differential amplifying circuit 20. A parasitic capacitor 10 exists between the substrate potential output terminal 9 and the ground 2 and, at the same time, a load impedance 10a exists therebetween corresponding to a current of the substrate, a leakage current and the like flowing during operation of the dynamic RAM. The reference potential generating circuit 11b serves to charge a reference potential point 9a with a reference potential $V_{REF}$ upon receipt of the pulse signal $\phi$ from the pulse generating circuit 3. The reference potential point 9b is connected to a second input terminal 31R of the differential amplifying circuit 20. In addition, a capacitor 10b of less than 1 pF is connected between the reference potential point 9b and the ground 2.

The differential amplifying circuit 20 performs differential amplification between the substrate potential $V_{SUB}$ applied to the first input terminal 31L and the reference potential $V_{REF}$ applied to the second input terminal 31R and provides the result to an output terminal 32. The differential amplifying circuit 20 includes timing signal input terminals 33, 34 and 35. Those timing signal input terminals 33, 34 and 35 receive the pulse signal $\phi$ from the pulse generating circuit 3, the pulse signal $\phi s$ and the pulse signal $\bar{\phi}$, respectively. The pulse signals $\phi s$ and $\bar{\phi}$ are provided from a timing signal generating circuit to be described afterwards (with reference to FIG. 8).

The first AC power supply 40 comprises a P channel MOS FET (referred to hereinafter as PMOS FET) 41 and an N channel MOS FET (referred to hereinafter as NMOS FET) 42 connected in series between the power supply terminal 1 and the ground 2. More specifically, the source of the PMOS FET 41 and the source of the NMOS FET 42 are connected to the power supply terminal 1 and the ground 2, respectively, and the respective drains thereof are connected to each other at a node 43. The respective gates of the PMOS FET 41 and the NMOS FET 42 are connected to the output terminal 32 of the differential amplifying circuit 20.

Now, a construction of the differential amplifying circuit 20 will be described. The differential amplifying circuit 20 comprises a CMOS flip-flop circuit formed by PMOS FET's 21L and 21R and NMOS FET's 22L and 22R. The respective sources of the PMOS FET's 21L and 21R are connected to the power supply terminal 1. The drains of the PMOS FET's 21L and 21R are connected to the drains of the NMOS FET's 22L and 22R through a left signal terminal 23L and a right signal terminal 23R, respectively, of the above stated CMOS flip-flop circuit. The gate of the PMOS FET 21L is connected to the right signal terminal 23R and is also connected to the gate of the NMOS FET 22L. The gate of the NMOS FET 21R is connected to the left signal terminal 23L and is also connected to the gate of the NMOS FET 22R. The sources of the NMOS FET's 22L and 22R are connected commonly to the ground 2 through the drain and the source of the NMOS FET 24. The gate of the NMOS FET 24 is connected to a timing signal input terminal 34. The above stated PMOS FET's 21L and 21R are connected in parallel with PMOS FET's 25L and 25R, respectively. The respective gates of the PMOS FET's 25L and 25R are connected to a timing signal input terminal 33. The left signal terminal 23L of the CMOS flip-flop circuit is connected to the gate of a PMOS FET 26L, the drain of a PMOS FET 27L and the output terminal 32. On the other hand, the right signal terminal 23R of the CMOS flip-flop circuit is connected to the gate of a PMOS FET 26R and the drain of a PMOS FET 27R. The respective sources of the PMOS FET's 26L and 26R are connected to the power supply terminal 1. The drains of the PMOS FET's 26L and 26R are connected to the gates of the PMOS FET's 27L and 27R, respectively, and are connected commonly to a node 29. This node 29 is connected to the ground 2 through the drain and the source of an NMOS FET 30. The gate of the NMOS FET 30 is connected to a timing signal input terminal 35. The sources of the PMOS FET's 27L and 27R are connected to the power supply terminal 1 through the drains and the sources of PMOS FET's 28L and 28R, respectively. The gate of the PMOS FET 28L and the gate of the PMOS FET 28R are connected to a first input terminal 31L and a second input terminal 31R, respectively.

In the embodiment shown in FIG. 5 having the above stated circuit configuration, the first and second auxiliary potential generating circuits 11c and 11d having a small capacity for supplying electric current are operated if the load impedance 10a at the substrate potential output terminal 9 is a small value. At the time of turning on the power supply ($V_{DD}$) or if the load impedance 10a is a large value as in the above described case of operation, the main potential generating circuit 11a having a large capacity for supplying electric current is also operated. Thus, a loss in consumption of electric power in the case of light load can be prevented and the above stated disadvantage of the conventional circuit can be overcome. The main potential generating circuit 11a operates only in the case of heavy load as described above because a pulse signal is supplied from the output terminal 32 of the differential amplifying circuit 20 to the first AC power supply 40 only in this case so that AC voltage is applied from the first AC power supply 40 to the main potential generating circuit 11a.

Figure 6:
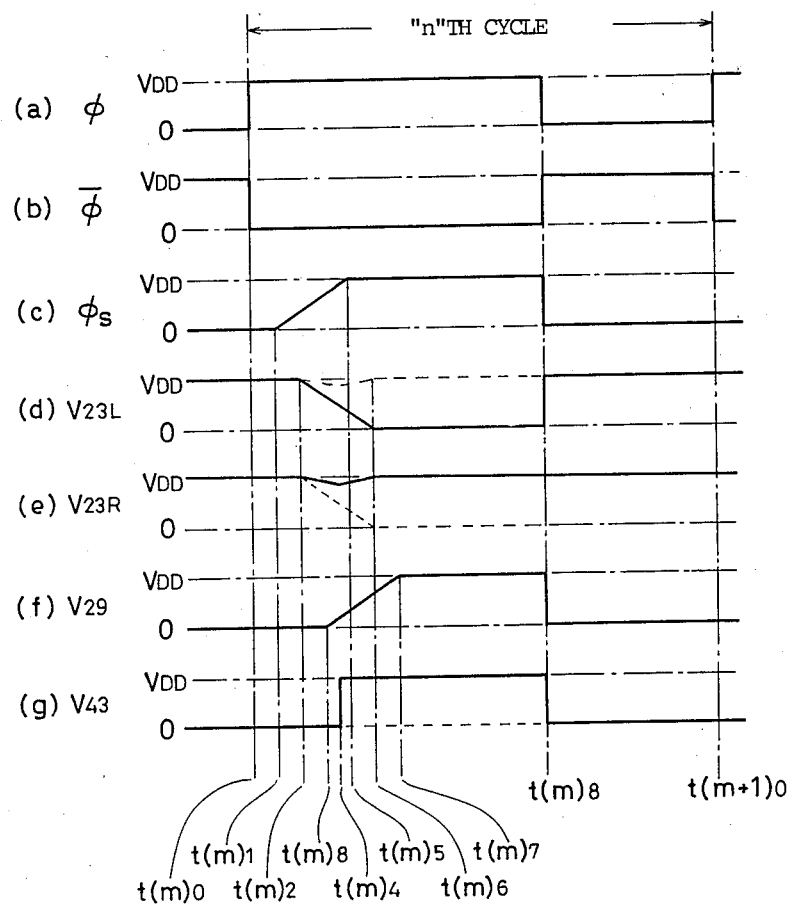
FIGS. 6 and 7 are timing charts for explaining operation of the embodiment shown in FIG. 5.

Referring first to the timing chart of FIG. 6, operation of the differential amplifying circuit 20 will be described. In FIG. 6, (a), (b), and (c) represent pulse signals $\phi$, $\bar{\phi}$ (an inverted pulse signal of the pulse signal $\phi$) and $\phi s$ applied to the timing signal input terminals 33, 35 and 34, respectively. In (d) and (e) of FIG. 6, the solid lines represent V23L and V23R in the condition of V31L>V31R and the dotted lines represents V23L and V23R in the condition of V31L<V31R, where V31L, V31R, V23L and V23R are potentials of the first input terminal 31L, the second input terminal 31R, the node 23L and the node 23R, respectively. (f) and (g) of FIG. 6 represent a potential V29 of the node 29 and a potential V43 of the node 43, respectively.

Immediately before the time t(m)0 at the "m"th cycle of the pulse signal $\phi$, the pulse signals $\phi$ and $\phi s$ are both equal to 0 volt and the pulse signal $\bar{\phi}$ is equal to $V_{DD}$. Consequently, the MOS FET 24 is turned off and the MOS FET's 25L and 25R are turned on, the potentials at the left signal terminal 23L and the right signal terminal 23R being both equal to $V_{DD}$ (as shown by (d) and (e) of FIG. 6). Accordingly, the MOS FET's 26L and 26R are turned off. Since the MOS FET 30 is turned on because of $\bar{\phi}=V_{DD}$, the potential at the node 29 is 0 volt (as shown by (f) of FIG. 6) and the MOS FET's 27L and 27R are turned on. However, since the potentials at both terminals 23L and 23R are $V_{DD}$ as described above, no current flows.

When the pulse signals $\phi$ and $\bar{\phi}$ are changed to $\phi=V_{DD}$ and $\bar{\phi}=0$ volt, respectively, at the time t(m)0 as shown by (a) and (b) of FIG. 6, the MOS FET's 25L, 25R and 30 are turned off. However, no change is caused in the respective potentials. When the pulse signal $\phi s$ rises slowly to $V_{DD}$, as shown by (c) of FIG. 6, from the time t(m)1 to the time t(m)4, the MOS FET 24 starts to be turned on at the time t(m)2 when the pulse signal $\phi s$ exceeds the threshold voltage, and the MOS FET 24 is entirely turned on at the time t(m)6. Consequently, the potential at the node 36 between the sources of the MOS FET's 22L and 22R and the drain of the MOS FET 24 becomes slowly 0 volt and a voltage begins to be applied to the flip-flop circuit formed by the 4 MOS FET's 21L, 21R, 22L and 22R. The differential amplifying circuit 20 has a configuration symmetrical with regard to a vertical line and the MOS FET's and the connections on the right and those on the left in the symmetrical relation have the same sizes or forms so that a balance is maintained in the differential amplifying circuit 20. However, the MOS FET 28L is selected to have a larger resistance value in the on state than that of the MOS FET 28R in the on state. In consequence of the symmetrical configuration of the differential amplifying circuit 20, if an extremely small potential difference exists between the terminals 23L and 23R at the initial stage, the potential at the terminal 23L exerts influence on the gates of the MOS FET's 21R and 22R and the potential at the terminal 23R exerts influence on the gates of the MOS FET's 21L and 22L so that feedback is applied to amplify the potential difference.

Assuming that the potential V9(=V31L) at the substrate potential output terminal 9 is higher than the potential V9b(=V31R) at the reference potential point 9b, the potential at the terminal 23L becomes lower than the potential at the terminal 23R because the resistance value of the MOS FET 28L in the on state is larger than that of the MOS FET 28R in the on state. As a result, as the pulse signal $\phi s$ slowly changes to $V_{DD}$, the potential V23L approaches 0 volt by the above stated feedback with a small delay. On the contrary, the potential V23R is temporarily lowered a little and then it is raised to $V_{DD}$ (as shown by the solid lines in (d) and (e) of FIG. 6). On the other hand, since only a relation reversed with regard to the vertical line is established in the case of V9<V9b and accordingly the potentials V23L and V23R become as shown by the dotted lines in (d) and (e) of FIG. 6.

The MOS FET's 26L and 26R are turned on when the terminals 23L and 23R attain a potential $V_{DD}V_{TH}$. However, if the conduction resistance values of those transistors are rapidly lowered to increase the potential V29 rapidly, the MOS FET's 27L and 27R will be turned off before input of the signal and for the purpose of presenting the MOS FET's 27L and 27R from being turned off, the drive capacity of the MOS FET's 26L and 26R is made sufficiently small. As a result, the potential V29 starts to rise from 0 volt at the time t(m)3 so as to attain $V_{DD}$ at the time t(m)7 (as shown by (f) of FIG. 6).

When the pulse signals $\phi$, $\bar{\phi}$ and $\phi s$ become $\phi=0$ volt, $\bar{\phi}=V_{DD}$ and $\phi s=0$ volt as shown by (a), (b) and (c) of FIG. 6, respectively, at the time t(m)8, the MOS FET 24 is turned off and MOS FET's 25L and 25R are turned on. Consequently, the potentials V23L and V23R attain $V_{DD}$ as shown by (d) and (e) of FIG. 6. When the potentials V23L and V23R become V23L = V23R = $V_{DD}$, the MOS FET's 26L and 26R are turned off and the MOS FET 30 is turned on and, consequently, the potential V29 becomes V29 = 0 volt (as shown by (f) of FIG. 6). When the potential V29 becomes V29 = 0 volt, the MOS FET's 27L and 27R are turned on. Then, the differential amplifying circuit 20 is returned to the state immediately before the state at the time t(m)0 and accordingly, operation of the (m+1)th cycle can be continued from the time t(m+1)0.

When the potential V23L of the differential amplying circuit 20 is applied to the input of the first AC power supply 40 through the output terminal 32, the potential V43 becomes as shown by (g) of FIG. 6 and in the case of V9 > V9b, a pulse is generated during a period from the time t(m)4 to the time t(m)8 as shown by the solid line, while in the case of V9 < V9b, no pulse is generated as shown by the broken line.

In the above explanation, it is assumed for the purpose of simplification that the differential amplifying circuit 20 is in a balanced state in the case of V9 = V9b. However, the drive capacities of the MOS FET's 28L and 28R shown in FIG. 1 have a small difference so that V9/V9b = $-V_{SUB}/(V_{DD} - 2V_{TH})$ is satisfied as the balanced condition, because it is easy to select the potential V9 in a heavy load condition to be a balanced potential $V_{SUB}\{> -(V_{DD} - 2V_{TH})\}$ and to select the potential V9b always in a light load condition to be $-(V_{DD} - 2V_{TH})$, while the potentials V9 and V9b in a light load condition both attain $-(V_{DD} - 2V_{TH})$. For example, a channel width of the MOS FET 28L is made a little larger than that of the MOS FET 28R.

Figure 7:
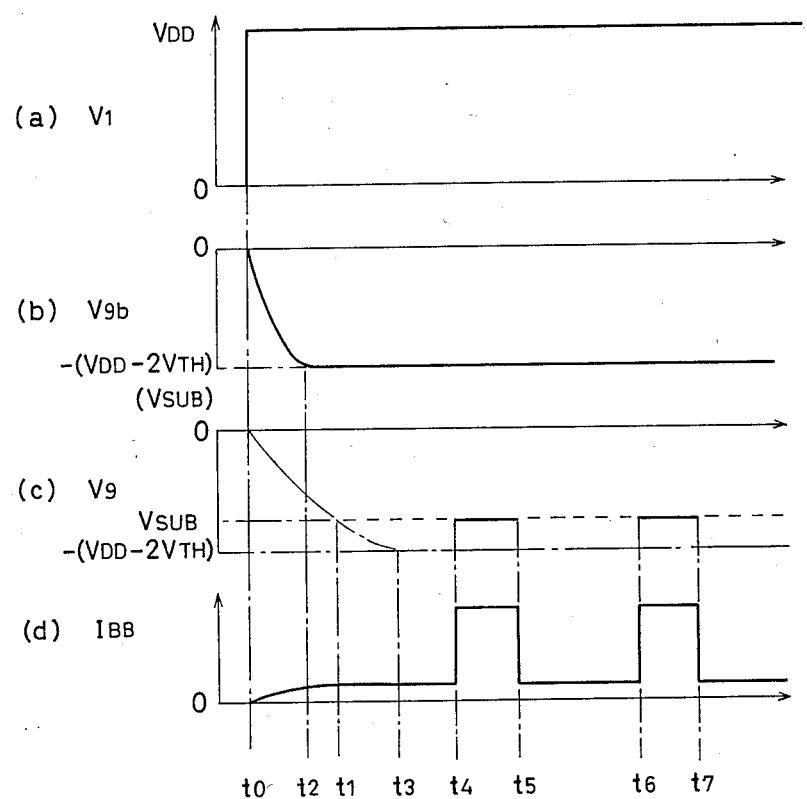

Referring now to the timing chart of FIG. 7, a total operation of the circuit shown in FIG. 5 will be described. When the power supply is turned on at the time t0 and the potential V1 at the power supply terminal 1 attains $V_{DD}$ as shown by (a) of FIG. 7, the potential V9b at the reference potential point 9b falls from 0 volt at the time t0 as shown by (b) of FIG. 7. The potential V9b falls rapidly to reach a desired potential $-(V_{DD} - 2V_{TH})$ at the time t2, because no load is connected to the reference potential point 9b. On the other hand, the potential V9 at the substrate potential output terminal 9 falls slowly from 0 volt at the time t0 as shown by (c) of FIG. 7. More specifically, the potential V9 falls to attain $-(V_{DD} - 2V_{TH})$ at the time t3. This is because a load is connected to the substrate potential output terminal 9. Since a pulse is applied to the main potential generating circuit 11a as shown by the solid line in (g) of FIG. 6 till the time t1 when the potential V9 attains $V_{SUB}$, the potential V9 continues to fall till the time t1. Current of the $I_{BB}$ of the substrate increases till the time t0 to the time t1 according to the falling of the potential V9 so that it attains a current value in the standby state. After that, if the dynamic RAM is in an operation state during a period from the time t4 to the time t5 and during a period from the time t6 to the time t7 to increase the current $I_{BB}$ as shown in the figure, the potential V9 tends to rise and therefore the main potential generating circuit 11a operates to charge the substrate potential output terminal 9. However, during a period from the time t1 to the time t4, during a period from the time t5 to the time t6 and after the time t7, no pulse is applied to the main potential generating circuit 11a as shown by the broken line in (g) of FIG. 6 and accordingly the main potential generating circuit 11a does not operate. In consequence, in those periods, the auxiliary inner potential generating circuits 11c and 11d with a small drive capacity which operates all the time supply a complementary amount of current $I_{BB}$ so that the potential V9 is maintained at $V_{SUB}$. In (c) of FIG. 7, the solid lines represent operation periods of the main potential generating circuit 11a and the broken lines represent stop periods thereof.

Figure 8:
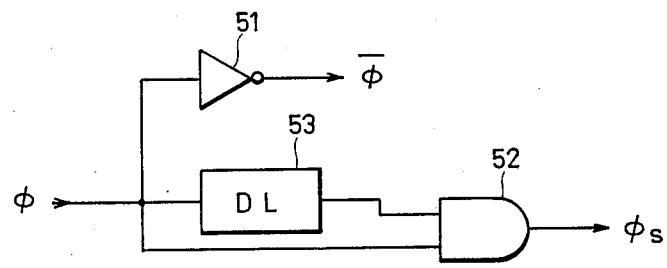
FIG. 8 is a diagram showing an example of a circuit for generating pulse signals $\bar{\phi}$ and $\phi s$ to be used in the embodiment shown in FIG. 5.

FIG. 8 is a diagram showing an example of a circuit for generating pulse signals $\overline{\phi}$ and $\phi s$ used in the embodiment shown in FIG. 5. Referring to FIG. 8, an inverter 51 generates a pulse signal $\overline{\phi}$ by inverting the pulse signal $\phi$ from the pulse generating circuit 3. An AND gate 52 generates a pulse signal $\phi s$ by obtaining a logical product between the output of the delay circuit 53 for delaying the pulse signal $\phi$ by t(m)1 − t(m)0 and the pulse signal $\phi$. The drive capacity of the MOS FET for raising output of the AND gate 52 to $V_{DD}$ is selected to be relatively small, whereby the signal $\phi s$ starts to rise at the time t(m)1, attains $V_{DD}$ at the time t(m)5 and falls at the time t(m)8 as shown in (c) of FIG. 6.

Although in the above described embodiment, the substrate potential output terminal 9 is also charged by the auxiliary potential generating circuits 11c and 11d, the terminal 9 may be charged only by the main potential generating circuit 11a.

In addition, in the above described embodiment, the differential amplifying circuit 20 serves to apply pulse signals to the first AC power supply 40 and to stop the supply of the pulse signals thereto. However, there may be provided a latch circuit for storing the potential V29 from the time t(m)7 to the time t(m)8 as shown in (f) of FIG. 6 so that only the output of the latch circuit is supplied. As for the first AC power supply 40, a CMOS 2-input NAND gate may be provided instead of the MOS FET's 41 and 42, the output of the above stated latch circuit being supplied to one of the inputs thereof and the output of the pulse generating circuit 3 or other pulse generating circuit being supplied to the other input thereof, whereby the output can be provided to the main potential generating circuit 11a.

Furthermore, although in the above described embodiment, the differential amplifying circuit 20 and the first AC power supply 40 both receive a pulse signal of the pulse generating circuit 3 or a pulse signal formed based on this pulse signal, pulse sources may be provided independently or pulse signals having different frequencies may be generated. Moreover, if the output frequency of the first AC power supply is made relatively large, the sizes of the respective components of the main potential generating circuit 11a can be decreased and by making relatively small the output frequencies of the differential amplifying circuit 20 and the pulse generating circuit 3, consumption of electric power can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An inner potential generating circuit for maintaining, at a prescribed potential, a potential of a substrate of a semiconductor device, comprising:
   a substrate potential output terminal connected to said substrate of said semiconductor device, a first AC power supply means connected to an external power supply for generating an AC voltage, said first AC power supply means including control means for turning said first AC power supply means off, a main potential generating circuit means connected to said first AC power supply means for charging said substrate potential output terminal with said prescribed potential, a second AC power supply means connected to said external power supply for generating a continuous AC voltage, a reference potential generating circuit means connected to said second AC power supply for charging a reference potential point (9b) with said prescribed potential, and a differential amplifying circuit means for comparing the potential of said substrate potential output terminal and the potential of said reference potential point and in response, operating said control means to turn said first AC power supply off when both of said potentials have a predetermined relationship.

* * * * *